US011626514B2

(12) United States Patent
Kishimoto et al.

(10) Patent No.: US 11,626,514 B2
(45) Date of Patent: Apr. 11, 2023

(54) TRENCH VERTICAL POWER MOSFET WITH CHANNEL INCLUDING REGIONS WITH DIFFERENT CONCENTRATIONS

(71) Applicants: Kabushiki Kaisha Toshiba, Tokyo (JP); Toshiba Electronic Devices & Storage Corporation, Tokyo (JP)

(72) Inventors: Hiroyuki Kishimoto, Nonoichi Ishikawa (JP); Hiroaki Katou, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 178 days.

(21) Appl. No.: 17/007,241

(22) Filed: Aug. 31, 2020

(65) Prior Publication Data

US 2021/0296489 A1 Sep. 23, 2021

(30) Foreign Application Priority Data

Mar. 19, 2020 (JP) .............................. JP2020-050005

(51) Int. Cl.
*H01L 29/78* (2006.01)
*H01L 29/66* (2006.01)
(Continued)

(52) U.S. Cl.
CPC ........ *H01L 29/7813* (2013.01); *H01L 27/088* (2013.01); *H01L 29/0653* (2013.01);
(Continued)

(58) Field of Classification Search
CPC ............... H01L 27/088; H01L 29/0865; H01L 29/0869; H01L 29/1037; H01L 29/1041;
(Continued)

(56) References Cited

U.S. PATENT DOCUMENTS 7,112,843 B2    9/2006  Takaishi
10,236,368 B2   3/2019  Hikasa
(Continued)

FOREIGN PATENT DOCUMENTS

JP    2004-303964 A    10/2004
JP    2017-183346 A    10/2017
(Continued)

OTHER PUBLICATIONS

Jacky C. W. Ng, et al, "A New Trench Power MOSFET With an Inverted L-Shaped Source Region", IEEE Electron Device Letters, vol. 31, No. 11, Nov. 2010, pp. 1284-1286.

*Primary Examiner* — Marcos D. Pizarro
(74) *Attorney, Agent, or Firm* — Allen & Overy LLP

(57) ABSTRACT

A semiconductor device includes: a first semiconductor layer of first conductivity type; a second semiconductor layer of first conductivity type provided on the first semiconductor layer; a first semiconductor region of second conductivity type provided on the second semiconductor layer; a second semiconductor region of first conductivity type provided on the first semiconductor region; a first electrode provided in a first trench, the first trench reaching the second semiconductor layer from above the first semiconductor region, the first electrode facing the first semiconductor region via a first insulating film; a second electrode provided in a second trench, the second trench reaching the second semiconductor layer from above the first semiconductor region, the second electrode facing the first semiconductor region via a second insulating film; a third electrode including a first electrode portion, a second electrode portion provided on the first electrode portion and a third electrode portion provided on the second electrode portion, the first electrode portion being provided between the first trench and the second trench, the first electrode (Continued)

portion reaching the first semiconductor region from above the second semiconductor region, the first electrode portion being electrically connected to the first semiconductor region and the second semiconductor region; a third semiconductor region provided between the third electrode and the second semiconductor region provided between the first insulating film and the third electrode, the third semiconductor region having a higher concentration of impurities of second conductivity type than the first semiconductor region; a fourth semiconductor region provided between the third electrode and the second semiconductor region provided between the second insulating film and the third electrode, the fourth semiconductor region having a higher concentration of impurities of second conductivity type than the first semiconductor region; and a fifth semiconductor region provided between the first semiconductor region and the third electrode, the fifth semiconductor region being provided apart from the third semiconductor region and the fourth semiconductor region, the fifth semiconductor region having a higher concentration of impurities of second conductivity type than the first semiconductor region.

12 Claims, 12 Drawing Sheets

(51) Int. Cl.
| | | |
|---|---|---|
| | *H01L 27/088* | (2006.01) |
| | *H01L 29/06* | (2006.01) |
| | *H01L 29/423* | (2006.01) |
| | *H01L 29/40* | (2006.01) |
| | *H01L 29/08* | (2006.01) |
| | *H01L 29/10* | (2006.01) |
| | *H01L 29/417* | (2006.01) |

(52) U.S. Cl.
CPC ...... *H01L 29/0865* (2013.01); *H01L 29/0869* (2013.01); *H01L 29/105* (2013.01); *H01L 29/1037* (2013.01); *H01L 29/1041* (2013.01); *H01L 29/1045* (2013.01); *H01L 29/1095* (2013.01); *H01L 29/407* (2013.01); *H01L 29/41741* (2013.01); *H01L 29/41766* (2013.01); *H01L 29/4236* (2013.01); *H01L 29/42376* (2013.01); *H01L 29/66727* (2013.01); *H01L 29/66734* (2013.01)

(58) Field of Classification Search
CPC . H01L 29/1045; H01L 29/105; H01L 29/407; H01L 29/41741; H01L 29/41766; H01L 29/4236; H01L 29/66727; H01L 29/66734; H01L 29/7813
See application file for complete search history.

(56) References Cited

U.S. PATENT DOCUMENTS

| | | | |
|---|---|---|---|
| 2016/0079374 A1* | 3/2016 | Okumura | H01L 29/407 |
| | | | 257/330 |
| 2018/0012956 A1 | 1/2018 | Ohashi et al. | |
| 2018/0226473 A1 | 8/2018 | Kobayashi et al. | |
| 2019/0273157 A1* | 9/2019 | Yilmaz | H01L 29/66727 |
| 2021/0202704 A1 | 7/2021 | Kashimoto et al. | |
| 2021/0226041 A1* | 7/2021 | Yilmaz | H01L 29/41741 |

FOREIGN PATENT DOCUMENTS

| | | |
|---|---|---|
| JP | 2018-006639 A | 1/2018 |
| JP | 2018-014392 A | 1/2018 |
| JP | 2018-046253 A | 3/2018 |
| JP | 2019-165065 A | 9/2019 |
| JP | 2021-108322 A | 7/2021 |

* cited by examiner

TRENCH VERTICAL POWER MOSFET WITH CHANNEL INCLUDING REGIONS WITH DIFFERENT CONCENTRATIONS

CROSS-REFERENCE TO RELATED APPLICATION

This application is based upon and claims the benefit of priority from Japanese Patent Application No. 2020-050005, filed on Mar. 19, 2020, the entire contents of which are incorporated herein by reference.

FIELD

Embodiments described herein relate generally to a semiconductor device.

BACKGROUND

A semiconductor device such as a metal oxide semiconductor field effect transistor (MOSFET) is used for power conversion and the like. Such a semiconductor device desirably has high reliability.

DETAILED DESCRIPTION

Figure 1:
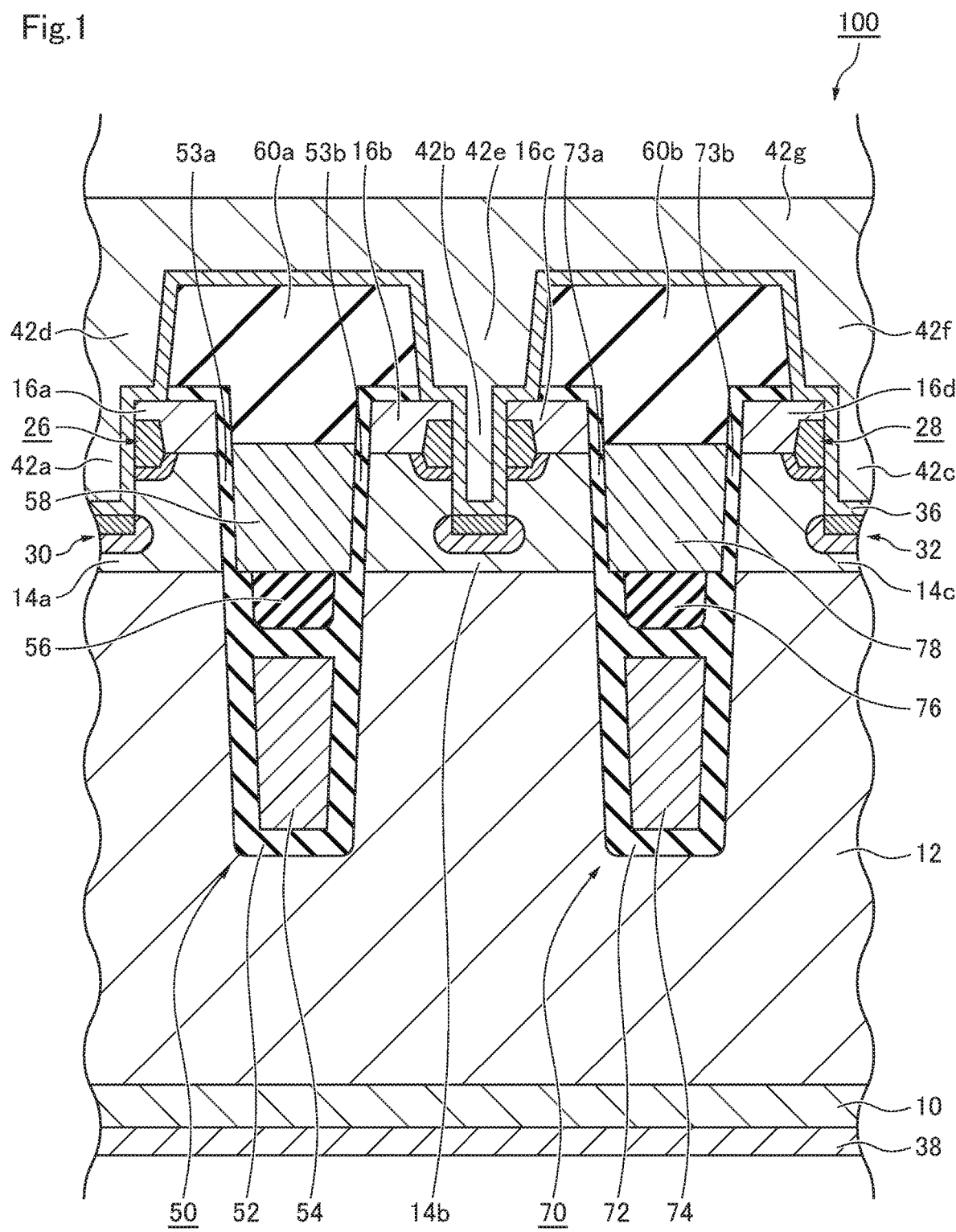
FIG. 1 is a schematic cross-sectional view of a semiconductor device according to a first embodiment.
Figure 1:
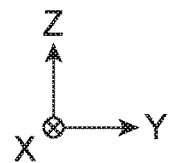

Hereinafter, embodiments of the present disclosure will be described with reference to the drawings. Note that in the following description, the same members and the like are denoted by the same reference numerals, and description of members and the like once described is appropriately omitted.

Here, upward in the drawings is described as "up", and downward in the drawings is described as "down" in order to indicate a positional relationship of parts and the like. Here, the terms "up" and "down" do not necessarily indicate a relationship with the direction of gravity.

Hereinafter, a case where a first conductivity type is n-type and a second conductivity type is p-type will be exemplified.

In the following description, notations of $n^+$, $n$, $n^-$, $p^+$, $p$, and $p^-$ indicate a relative level of an impurity concentration of each of the conductivity types. That is, $n^+$ indicates that an impurity concentration of n-type is relatively higher than n, and $n^-$ indicates that the impurity concentration of n-type is relatively lower than n. $p^+$ indicates that an impurity concentration of p-type is relatively higher than p, and $p^-$ indicates that the impurity concentration of p-type is relatively lower than p. Note that $n^+$ type and $n^-$ type may be simply referred to as n type, and $p^+$ type and $p^-$ type may be simply referred to as p type.

First Embodiment

A semiconductor device according to the present embodiment includes: a first semiconductor layer of first conductivity type; a second semiconductor layer of first conductivity type provided on the first semiconductor layer; a first semiconductor region of second conductivity type provided on the second semiconductor layer; a second semiconductor region of first conductivity type provided on the first semiconductor region; a first electrode provided in a first trench, the first trench reaching the second semiconductor layer from above the first semiconductor region, the first electrode facing the first semiconductor region via a first insulating film; a second electrode provided in a second trench, the second trench reaching the second semiconductor layer from above the first semiconductor region, the second electrode facing the first semiconductor region via a second insulating film; a third electrode including a first electrode portion, a second electrode portion provided on the first electrode portion and a third electrode portion provided on the second electrode portion, the first electrode portion being provided between the first trench and the second trench, the first electrode portion reaching the first semiconductor region from above the second semiconductor region, the first electrode portion being electrically connected to the first semiconductor region and the second semiconductor region; a third semiconductor region provided between the third electrode and the second semiconductor region provided between the first insulating film and the third electrode, the third semiconductor region having a higher concentration of impurities of second conductivity type than the first semiconductor region; a fourth semiconductor region provided between the third electrode and the second semiconductor region provided between the second insulating film and the third electrode, the fourth semiconductor region having a higher concentration of impurities of second conductivity type than the first semiconductor region; and a fifth semiconductor region provided between the first semiconductor region and the third electrode, the fifth semiconductor region being provided apart from the third semiconductor region and the fourth semiconductor region, the fifth semiconductor region having a higher concentration of impurities of second conductivity type than the first semiconductor region.

Figure 2:
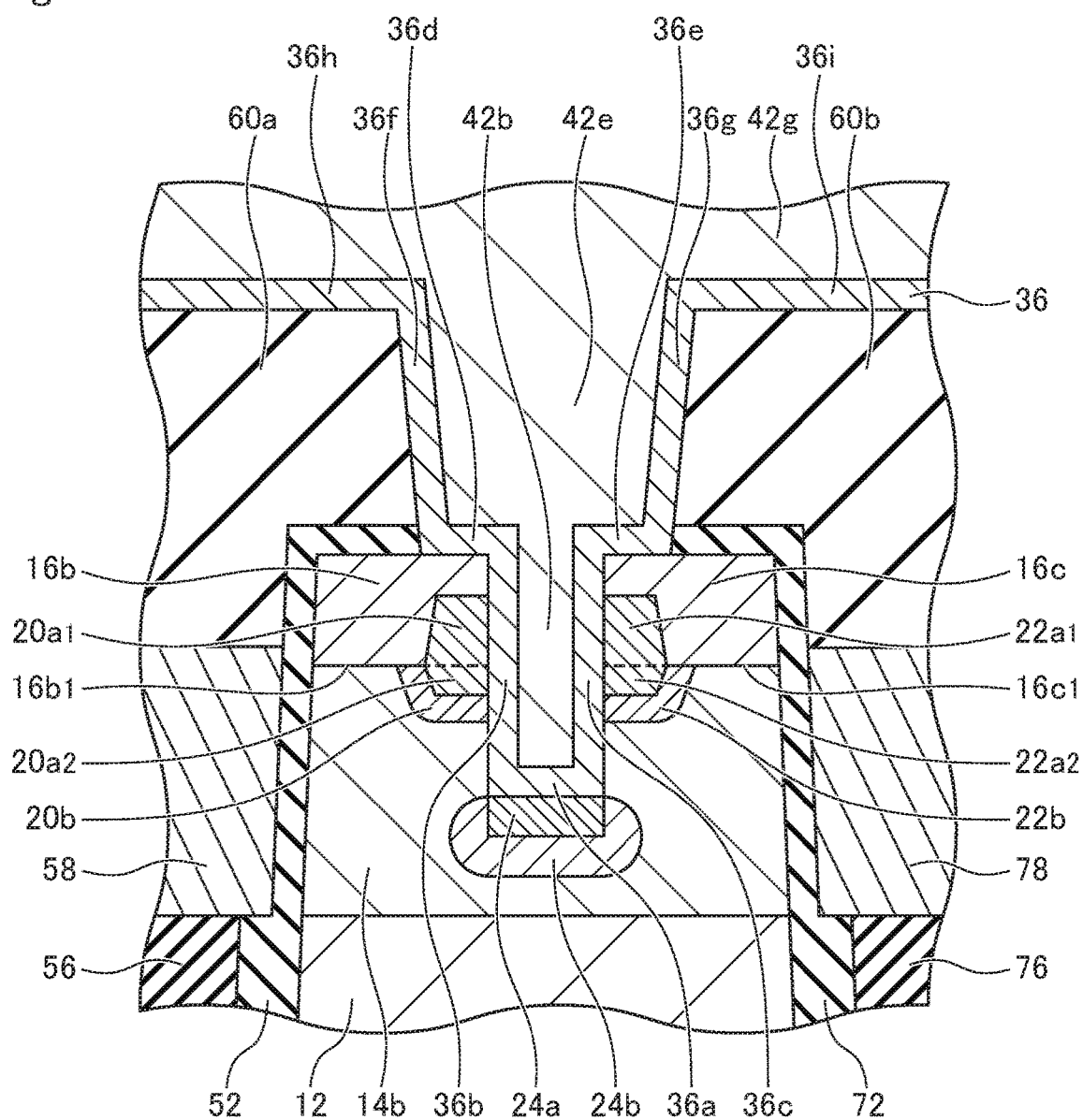
FIG. 2 is a schematic cross-sectional view of a main part of the semiconductor device according to the first embodiment.
Figure 2:
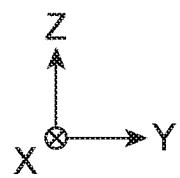

FIG. 1 is a schematic cross-sectional view of a semiconductor device 100 according to the present embodiment. FIG. 2 is a schematic cross-sectional view of a main part of the semiconductor device 100 according to the present embodiment. The semiconductor device 100 is, for example, a vertical MOSFET.

The semiconductor device 100 includes a drain layer 10, a drift layer 12, a base region 14, a source region 16, a first p$^+$ region 20, a second p$^+$ region 22, a third p$^+$ region 24, a barrier metal 36, a drain electrode 38, a source electrode 42, a first trench 50, a third insulating film 52, an insulating film 53, a first field plate electrode 54, a fifth insulating film 56, a first gate electrode 58, an interlayer insulating film 60, a second trench 70, a fourth insulating film 72, an insulating film 73, a second field plate electrode 74, a sixth insulating film 76, and a second gate electrode 78.

Note that the drain layer 10 is an example of the first semiconductor layer. The drift layer 12 is an example of the second semiconductor layer. The base region 14 is an example of the first semiconductor region. The source region 16 is an example of the second semiconductor region. The first p$^+$ region 20 is an example of the third semiconductor region. The second p$^+$ region 22 is an example of the fourth semiconductor region. The third p$^+$ region 24 is an example of the fifth semiconductor region. A second electrode portion 42$b$ which is a part of the source electrode 42 is an example of the third electrode. The first field plate electrode 54 is an example of a fourth electrode. The first gate electrode 58 is an example of the first electrode. The second field plate electrode 74 is an example of a fifth electrode. The second gate electrode 78 is an example of the second electrode. The drain electrode 38 is an example of a sixth electrode. An insulating film 53$b$ as the insulating film 53 is an example of the first insulating film. An insulating film 73$a$ as the insulating film 73 is an example of the second insulating film.

The drain layer 10 functions as a drain of the MOSFET. The drain layer 10 contains, for example, a semiconductor material of n$^+$ type.

The drain electrode 38 is provided under the drain layer 10 and is electrically connected to the drain layer 10. In other words, the drain layer 10 is provided between the drain electrode 38 and the drift layer 12. The drain electrode 38 functions as a drain electrode of the MOSFET.

The drift layer 12 is provided on the drain layer 10. The drift layer 12 functions as a drift layer of the MOSFET. The drift layer 12 contains, for example, a semiconductor material of n$^-$ type.

Here, an X direction, a Y direction perpendicular to the X direction, and a Z direction perpendicular to the X direction and the Y direction are defined. The drain electrode 38, the drain layer 10, and the drift layer 12 are provided parallel to an XY plane parallel to the X direction and the Y direction. The Z direction is a direction in which the drain electrode 38, the drain layer 10, and the drift layer 12 are stacked.

The base region 14 is provided on the drift layer 12. The base region 14 functions as a base of the MOSFET. The base region 14 forms a channel and allows carriers to flow between the source region 16 and the drain layer 10 when a voltage is applied to the first gate electrode 58 or the second gate electrode 78. The base region 14 contains, for example, a semiconductor material of p$^-$ type. The semiconductor device 100 includes base regions 14$a$, 14$b$, and 14$c$ as the base region 14.

The source region 16 is provided on the base region 14. The source region 16 functions as a source of the MOSFET. When an appropriate voltage is applied to the first gate electrode 58 or the second gate electrode 78, carriers flow between the source region 16 and the drain layer 10. The source region 16 contains, for example, a semiconductor material of n$^+$ type. The semiconductor device 100 includes source regions 16$a$, 16$b$, 16$c$, and 16$d$ as the source region 16.

The first trench 50 is formed so as to reach the drift layer 12 from above the base region 14.

The second trench 70 is formed so as to reach the drift layer 12 from above the base region 14.

The first field plate electrode 54 is provided in the first trench 50 via the third insulating film 52. The first field plate electrode 54 is provided, for example, in order to reduce concentration of a reverse electric field between the first gate electrode 58 and the drain electrode 38 to increase a breakdown voltage. For example, the first field plate electrode 54 has a portion extending upward in a portion (not illustrated) provided in the depth direction of FIG. 1. The first field plate electrode 54 is electrically connected to the source electrode 42 using the upwardly extending portion. Note that how to connect the first field plate electrode 54 to the source electrode 42 is not limited to this connecting method. The first field plate electrode 54 does not have to be provided.

The second field plate electrode 74 is provided in the second trench 70 via the fourth insulating film 72. The second field plate electrode 74 is provided, for example, in order to reduce concentration of a reverse electric field between the second gate electrode 78 and the drain electrode 38 to increase a breakdown voltage. For example, the second field plate electrode 74 has a portion extending upward in a portion (not illustrated) provided in the depth direction of FIG. 1. The second field plate electrode 74 is electrically connected to the source electrode 42 using the upwardly extending portion. Note that how to connect the second field plate electrode 74 to the source electrode 42 is not limited to this connecting method. The second field plate electrode 74 does not have to be provided.

The third insulating film 52 is provided in the first trench 50. The third insulating film 52 functions as a field plate insulating film that insulates the first field plate electrode 54 from the drift layer 12. For example, the third insulating film 52 may be provided around the first field plate electrode 54 so as to cover the first field plate electrode 54.

The insulating film 53 is provided on the third insulating film 52 in the first trench 50. An insulating film 53$a$ as the insulating film 53 is provided between the base region 14$a$ and the first gate electrode 58. An insulating film 53$b$ as the insulating film 53 is provided between the base region 14$b$ and the first gate electrode 58. In other words, the first gate electrode 58 is provided in the first trench 50 so as to face the base region 14$a$ via the insulating film 53$a$. The first gate electrode 58 is provided in the first trench 50 so as to face the base region 14$b$ via the insulating film 53$b$. The insulating film 53 functions as a gate insulating film that insulates the first gate electrode 58 from the base region 14. The insulating film 53$a$ and the insulating film 53$b$ each have a smaller film thickness than the third insulating film 52 in a direction perpendicular to a direction in which the drain layer 10 and the drift layer 12 are stacked.

The third insulating film 52 and the insulating film 53 insulate the first field plate electrode 54 and the first gate electrode 58 from the drift layer 12, the base region 14, and the source region 16.

The fourth insulating film 72 is provided in the second trench 70. The fourth insulating film 72 functions as a field plate insulating film that insulates the second field plate electrode 74 from the drift layer 12. For example, the fourth insulating film 72 may be provided around the second field plate electrode 74 so as to cover the second field plate electrode 74.

The insulating film 73 is provided on the fourth insulating film 72 in the second trench 70. An insulating film 73a as the insulating film 73 is provided between the base region 14b and the second gate electrode 78. An insulating film 73b as the insulating film 73 is provided between the base region 14c and the second gate electrode 78. In other words, the second gate electrode 78 is provided in the second trench 70 so as to face the base region 14b via the insulating film 73a. The second gate electrode 78 is provided in the second trench 70 so as to face the base region 14c via the insulating film 73b. The insulating film 73 functions as a gate insulating film that insulates the second gate electrode 78 from the base region 14. The insulating film 73a and the insulating film 73b each have a smaller film thickness than the fourth insulating film 72 in a direction perpendicular to a direction in which the drain layer 10 and the drift layer 12 are stacked. Note that the insulating film 73 may be formed simultaneously in the same step as the fourth insulating film 72, or may be formed in a different step.

The fourth insulating film 72 and the insulating film 73 insulate the second field plate electrode 74 and the second gate electrode 78 from the drift layer 12, the base region 14, and the source region 16.

The fifth insulating film 56 is provided above the first field plate electrode 54. For example, when the third insulating film 52 is provided so as to cover the first field plate electrode 54, the fifth insulating film 56 is provided on a part of the third insulating film 52. The fifth insulating film 56 is formed of, for example, phosphosilicate glass (PSG). Note that the third insulating film 52 may be formed in a portion where the fifth insulating film 56 is provided, instead of the fifth insulating film 56.

The sixth insulating film 76 is provided above the second field plate electrode 74. For example, when the fourth insulating film 72 is provided so as to cover the second field plate electrode 74, the sixth insulating film 76 is provided on a part of the fourth insulating film 72. The sixth insulating film 76 is formed of, for example, phosphosilicate glass (PSG). Note that the fourth insulating film 72 may be formed in a portion where the sixth insulating film 76 is provided instead of the sixth insulating film 76.

The first gate electrode 58 is provided on the fifth insulating film 56. The first gate electrode 58 functions as a gate of the MOSFET.

The second gate electrode 78 is provided on the sixth insulating film 76. The second gate electrode 78 functions as a gate of the MOSFET.

An interlayer insulating film 60a (an example of a seventh insulating film) as the interlayer insulating film 60 is provided on the first gate electrode 58. An interlayer insulating film 60b (an example of an eighth insulating film) as the interlayer insulating film 60 is provided on the second gate electrode 78.

The source electrode 42 has a first electrode portion 42a, a second electrode portion 42b, a third electrode portion 42c, a fourth electrode portion 42d, a fifth electrode portion 42e (an example of a seventh electrode), a sixth electrode portion 42f, and a seventh electrode portion 42g. The seventh electrode portion 42g (an example of an eighth electrode) is provided over the interlayer insulating film 60. The fourth electrode portion 42d, the fifth electrode portion 42e, and the sixth electrode portion 42f are provided below the seventh electrode portion 42g so as to penetrate the interlayer insulating film 60. The first electrode portion 42a is provided below the fourth electrode portion 42d so as to reach the base region 14a. The second electrode portion 42b is provided below the fifth electrode portion 42e so as to reach the base region 14b. The third electrode portion 42c is provided below the sixth electrode portion 42f so as to reach the base region 14c. The source electrode 42 functions as a source of the MOSFET. For example, the first electrode portion 42a, the second electrode portion 42b, the third electrode portion 42c, the fourth electrode portion 42d, the fifth electrode portion 42e, the sixth electrode portion 42f, and the seventh electrode portion 42g are formed simultaneously. However, the first electrode portion 42a, the second electrode portion 42b, the third electrode portion 42c, the fourth electrode portion 42d, the fifth electrode portion 42e, the sixth electrode portion 42f, and the seventh electrode portion 42g do not have to be formed simultaneously.

First $p^+$ regions $20a_1$, $20a_2$, and $20b$ which are the first $p^+$ regions 20 are provided between a source region 16b and the second electrode portion 42b. The source region 16b is provided between the insulating film 53b and the second electrode portion 42b. The first $p^+$ region $20a_1$ is provided above a lower surface $16b_1$ of the source region 16b. The first $p^+$ region $20a_2$ is provided below the lower surface $16b_1$ of the source region 16b. The first $p^+$ region $20b$ is provided below and on a side of the first $p^+$ region $20a_2$ below the lower surface $16b_1$ of the source region 16b. The first $p^+$ regions $20a_1$, $20a_2$, and $20b$ each contain, for example, a $p^+$ type semiconductor material. The first $p^+$ region $20b$ is formed by diffusion of p-type impurities contained in the first $p^+$ regions $20a_1$ and $20a_2$ during a heat treatment for activating impurities. For example, the p-type impurity concentration of the first $p^+$ region $20b$ is lower than the p-type impurity concentration of each of the first $p^+$ regions $20a_1$ and $20a_2$. Note that the first $p^+$ region $20a_1$ is an example of a first portion, and the first $p^+$ region $20a_2$ is an example of a second portion. The lower surface $16b_1$ of the source region 16b is an example of a first lower surface.

Second $p^+$ regions $22a_1$, $22a_2$, and $22b$ which are the second $p^+$ regions 22 are provided between a source region 16c and the second electrode portion 42b. The source region 16c is provided between the insulating film 73a and the second electrode portion 42b. The second $p^+$ region $22a_1$ is provided above a lower surface $16c_1$ of the source region 16c. The second $p^+$ region $22a_2$ is provided below the lower surface $16c_1$ of the source region 16c. The second $p^+$ region $22b$ is provided below and on a side of the second $p^+$ region $22a_2$ below the lower surface $16c_1$ of the source region 16c. The second $p^+$ regions $22a_1$, $22a_2$, and $22b$ each contain, for example, a $p^+$ type semiconductor material. The second $p^+$ region $22b$ is formed by diffusion of p-type impurities contained in the second $p^+$ regions $22a_1$ and $22a_2$ during a heat treatment for activating impurities. For example, the p-type impurity concentration of the second $p^+$ region $22b$ is lower than the p-type impurity concentration of each of the second $p^+$ regions $22a_1$ and $22a_2$. Note that the second $p^+$ region $22a_1$ is an example of a third portion, and the second $p^+$ region $22a_2$ is an example of a fourth portion. The lower surface $16c_1$ of the source region 16c is an example of a second lower surface.

Here, the source region 16b extends over the first $p^+$ region 20. The source region 16c extends over the second $p^+$ region 22.

Similarly, a $p^+$ region 26 is provided between the first electrode portion 42a and the insulating film 53a, and a $p^+$ region 28 is provided between the third electrode portion 42c and the insulating film 73b.

Third p$^+$ regions 24a and 24b which are the third p$^+$ regions 24 are provided apart from the first p$^+$ region 20 and the second p$^+$ region 22 between the drift layer 12 and the second electrode portion 42b. The third p$^+$ regions 24a and 24b each contain, for example, a p$^+$ type semiconductor material. The third p$^+$ region 24b is formed by diffusion of p-type impurities contained in the third p$^+$ region 24a during a heat treatment for activating impurities. For example, the p-type impurity concentration of the third p$^+$ region 24b is lower than the p-type impurity concentration of the third p$^-$ region 24a.

Similarly, a p$^+$ region 30 is provided between the first electrode portion 42a and the drift layer 12, and a p$^+$ region 32 is provided between the third electrode portion 42c and the drift layer 12.

The barrier metal 36 is provided between the source electrode 42 and the base region 14, the source region 16, the first p$^+$ region 20, the second p$^+$ region 22, the third p$^+$ region 24, the p$^+$ region 26, the p$^+$ region 28, the p$^+$ region 30, the p$^+$ region 32, and the interlayer insulating film 60. The barrier metal 36 is a film used for preventing a reaction between the source electrode 42 and a semiconductor material used for the semiconductor device 100. The barrier metal 36 contains, for example, titanium (Ti), titanium nitride (TiN), tantalum (Ta), or tantalum nitride (TaN).

For example, as illustrated in FIG. 2, the third p$^+$ region 24a is in contact with a barrier metal 36a provided on a bottom surface of the second electrode portion 42b. For example, as illustrated in FIG. 2, the first p regions 20a$_1$, 20a$_2$, and 20b which are the first p$^+$ regions 20 are in contact with a barrier metal 36b provided on a left side surface of the second electrode portion 42b. For example, as illustrated in FIG. 2, the second p$^+$ regions 22a$_1$, 22a$_2$, and 22b which are the second p$^+$ regions 22 are in contact with a barrier metal 36c provided on a right side surface of the second electrode portion 42b. A barrier metal 36d is in contact with the fifth electrode portion 42e and the source region 16b. A barrier metal 36e is in contact with the fifth electrode portion 42e and the source region 16c. A barrier metal 36f is in contact with the interlayer insulating film 60a and the fifth electrode portion 42e. A barrier metal 36g is in contact with the interlayer insulating film 60b and the fifth electrode portion 42e. A barrier metal 36h is in contact with the seventh electrode portion 42g and the interlayer insulating film 60a. A barrier metal 36i is in contact with the seventh electrode portion 42g and the interlayer insulating film 60b. Note that the barrier metal 36a is an example of a first barrier metal portion. The barrier metal 36b is an example of a second barrier metal portion. The barrier metal 36c is an example of a third barrier metal portion. The barrier metal 36d is an example of a fourth barrier metal portion. The barrier metal 36e is an example of a fifth barrier metal portion. The barrier metal 36f is an example of a sixth barrier metal portion. The barrier metal 36g is an example of a seventh barrier metal portion. The barrier metal 36h is an example of an eighth barrier metal portion. The barrier metal 36i is an example of a ninth barrier metal portion.

A semiconductor material used for the drain layer 10, the drift layer 12, the base region 14, the source region 16, the first p$^+$ region 20, the second p$^+$ region 22, the third p$^+$ region 24, the p$^+$ region 26, the p$^+$ region 28, the p$^+$ region 30, and the p$^+$ region 32 are, for example, silicon (Si). However, the semiconductor material used for the drain layer 10, the drift layer 12, the base region 14, the source region 16, the first p$^+$ region 20, the second p$^+$ region 22, the third p$^+$ region 24, the p$^+$ region 26, the p$^+$ region 28, the p$^+$ region 30, and the p$^+$ region 32 may be another semiconductor material such as silicon carbide (SiC), gallium nitride (GaN), or gallium arsenide (GaAs).

When silicon is used as the semiconductor material, for example, arsenic (As), phosphorus (P), or antimony (Sb) can be used as n-type impurities, and boron (B) can be used as p-type impurities.

The first gate electrode 58, the second gate electrode 78, the first field plate electrode 54, and the second field plate electrode 74 each contain a conductive material such as polysilicon containing impurities.

The insulating film 53, the insulating film 73, the third insulating film 52, the fourth insulating film 72, and the interlayer insulating film 60 each contain an insulating material such as silicon oxide or silicon nitride (SiN).

The drain electrode 38 and the source electrode 42 each contain a metal such as aluminum (Al).

FIGS. 3 to 9 are schematic cross-sectional views illustrating a process of manufacturing the semiconductor device 100 according to the present embodiment.

Figure 3:
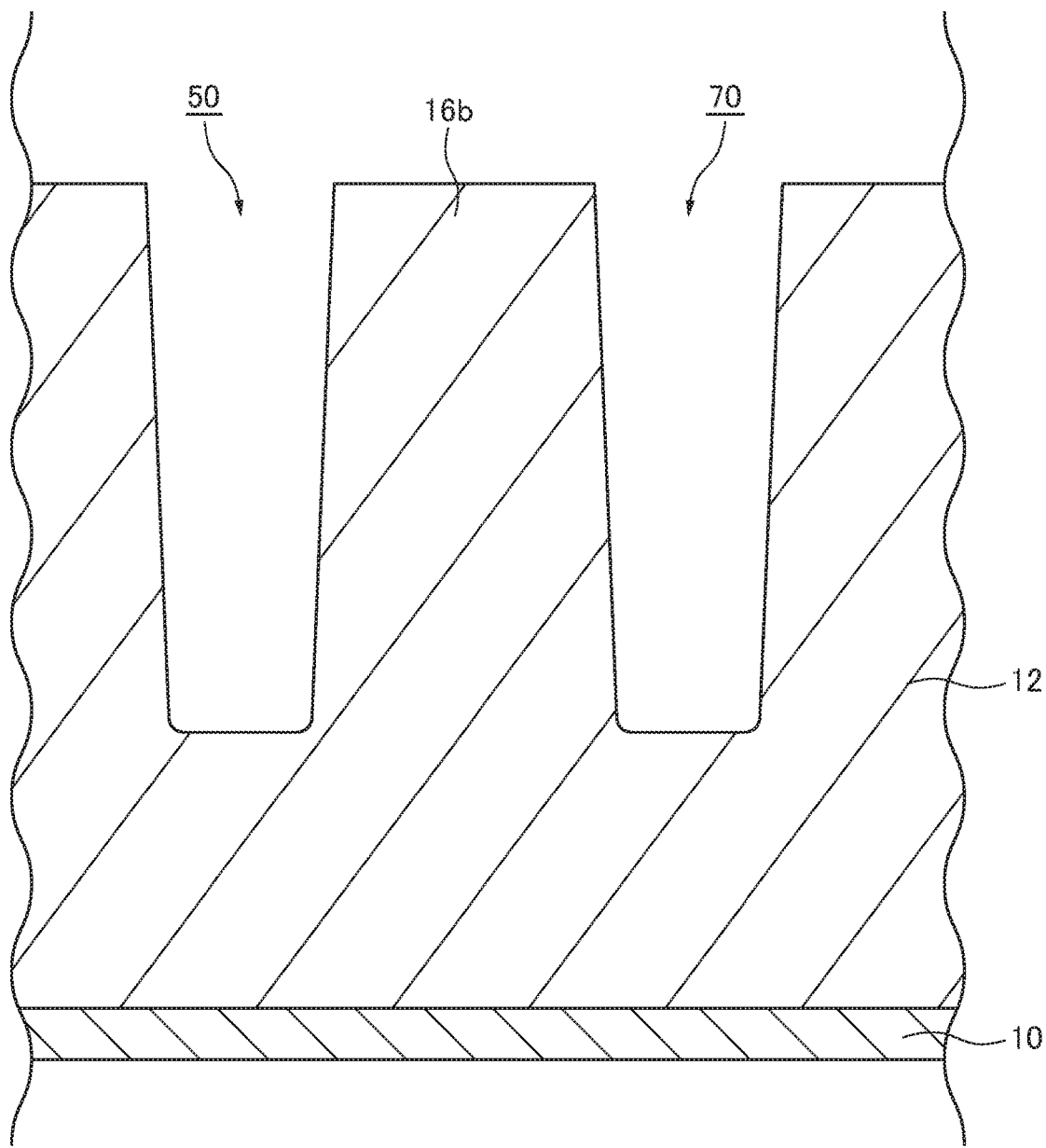
FIG. 3 is a schematic cross-sectional view illustrating a process of manufacturing the semiconductor device according to the first embodiment.

First, the drift layer 12 is formed on the drain layer 10 by, for example, epitaxial growth. For example, the drain layer 10 is used as a semiconductor substrate, and the drift layer 12 is formed on the drain layer 10 by epitaxial growth. Next, the first trench 50 and the second trench 70 are formed in the drift layer 12 by, for example, photolithography and reactive ion etching (RIE) (FIG. 3).

Figure 4:
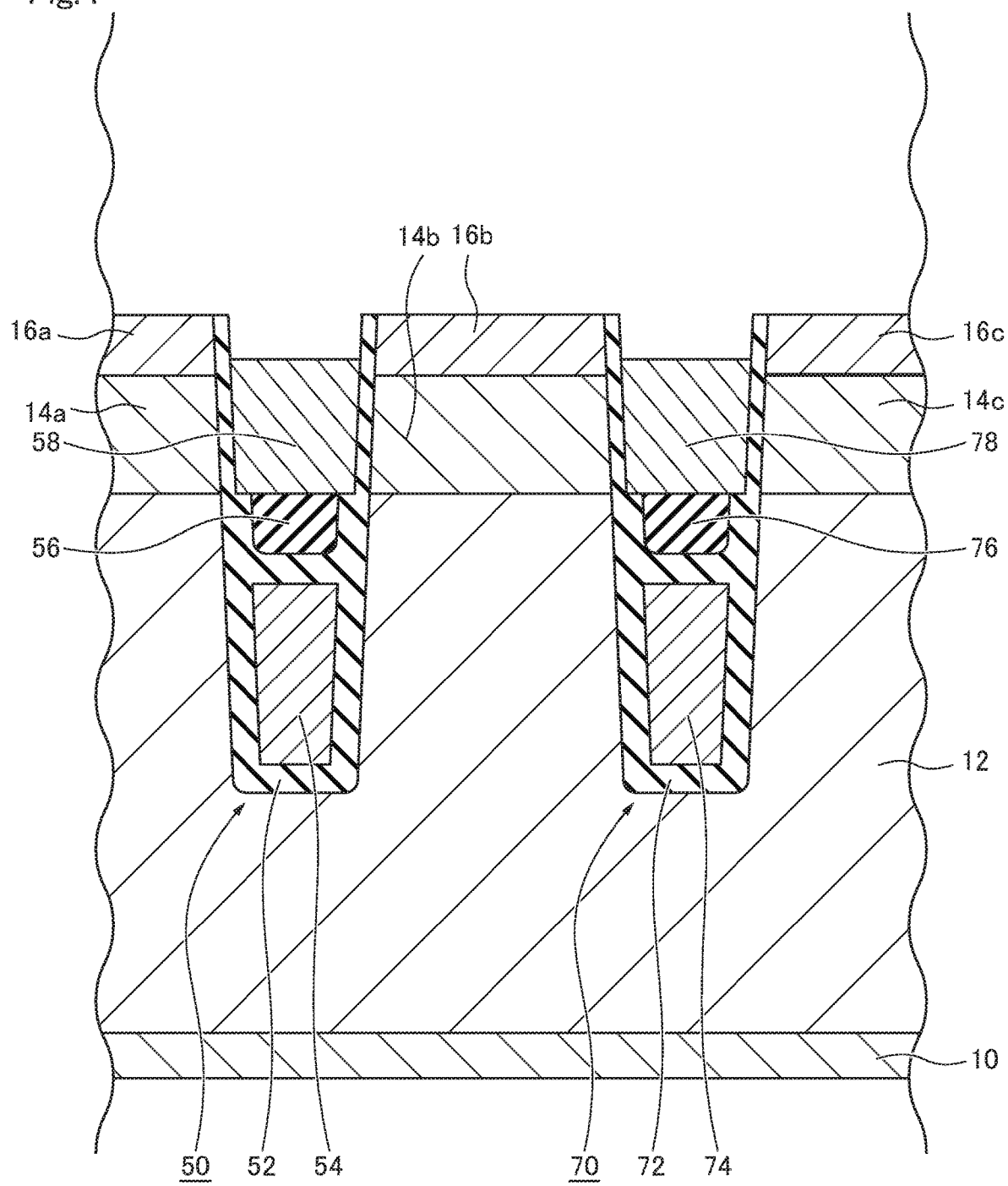
FIG. 4 is a schematic cross-sectional view illustrating the process of manufacturing the semiconductor device according to the first embodiment.

Next, a semiconductor device in the middle of manufacture illustrated in FIG. 4 is formed by, for example, a manufacturing method disclosed in Patent Document 2 (JP 2018-046253 A).

Figure 5:
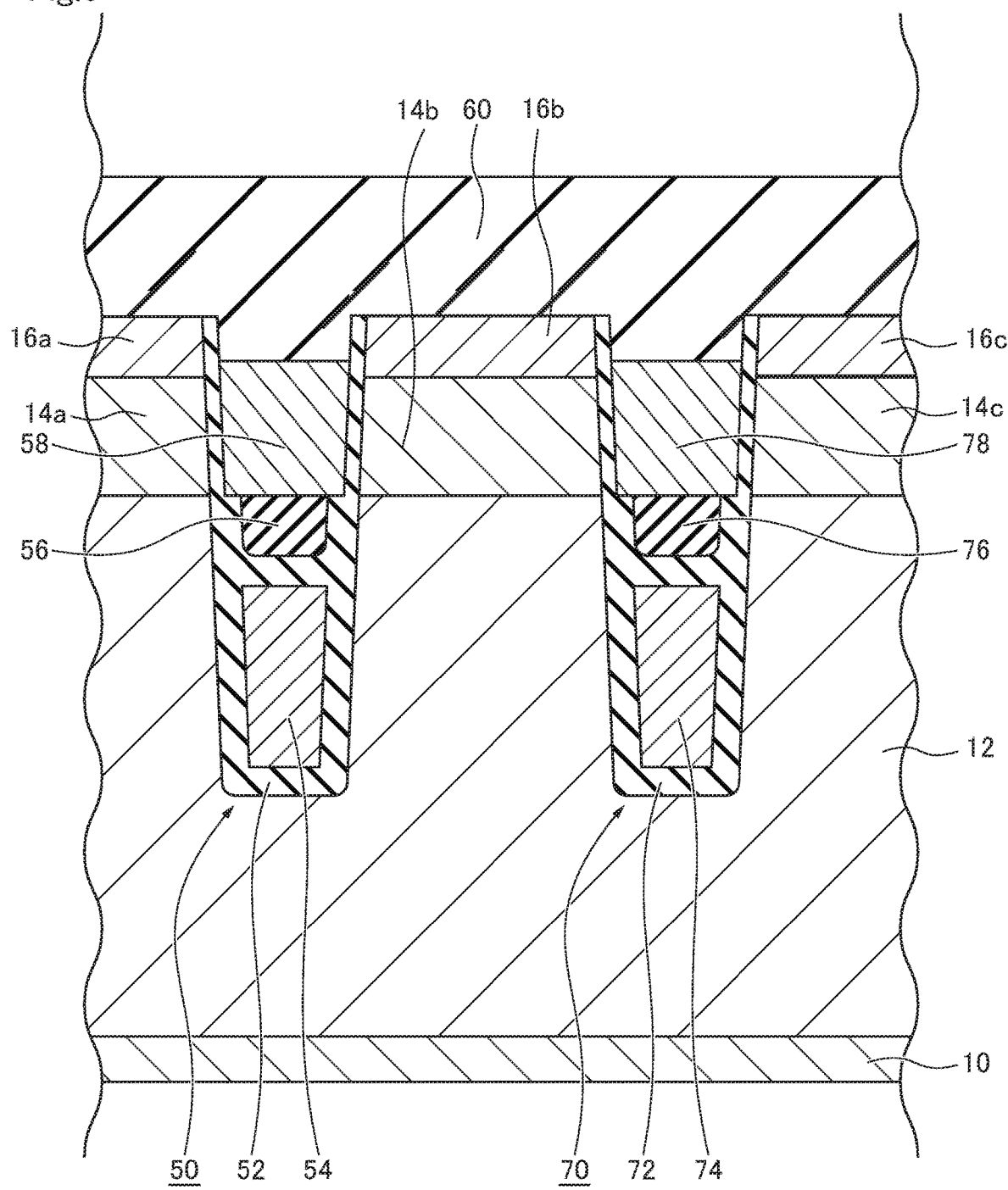
FIG. 5 is a schematic cross-sectional view illustrating the process of manufacturing the semiconductor device according to the first embodiment.

Next, the interlayer insulating film 60 is formed on the source region 16, the first gate electrode 58, and the second gate electrode 78 by, for example, CVD (FIG. 5).

Figure 6:
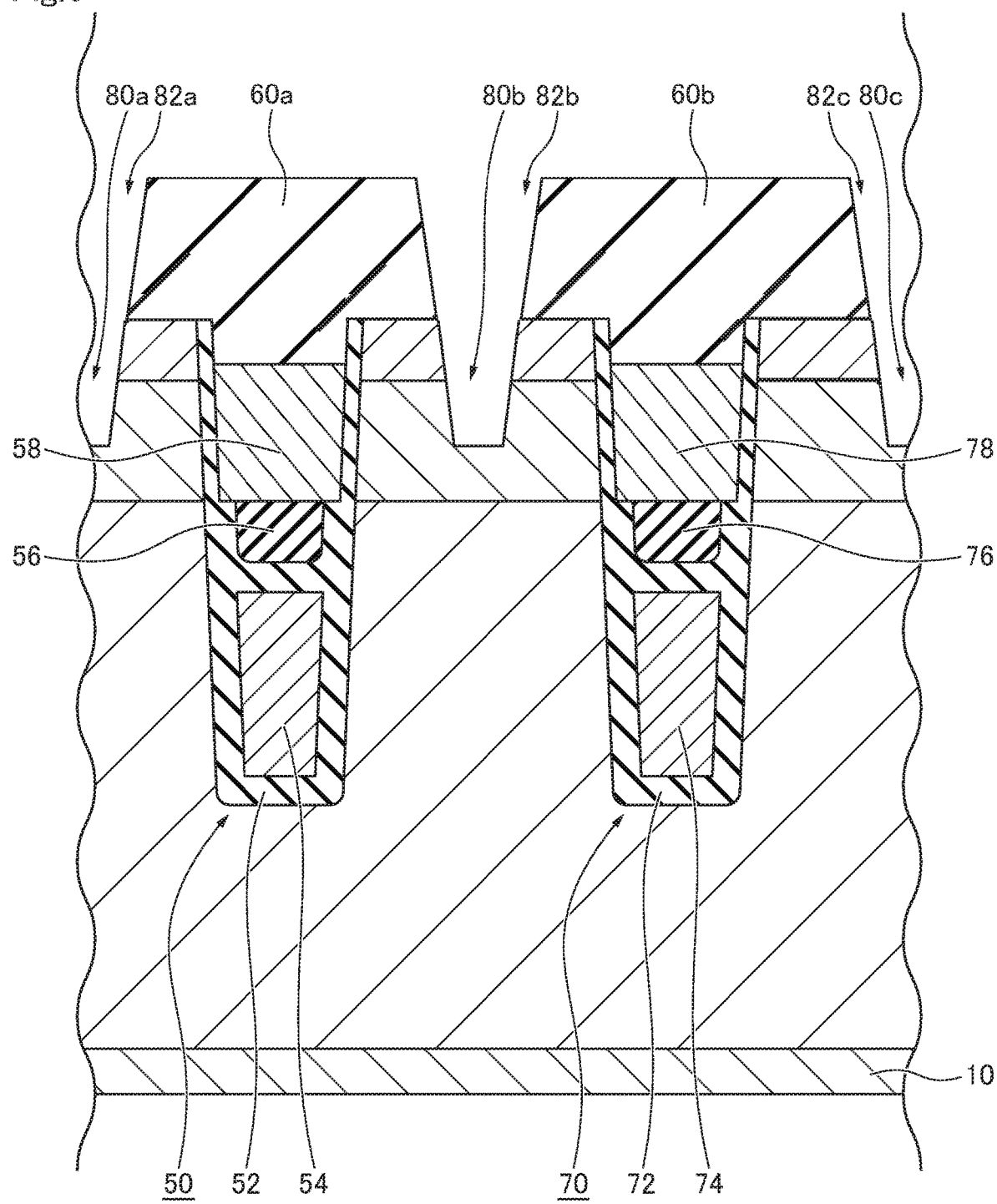
FIG. 6 is a schematic cross-sectional view illustrating the process of manufacturing the semiconductor device according to the first embodiment.

Next, etching is performed by, for example, photolithography and RIE to form a trench 82a, a trench 82b, and a trench 82c in the interlayer insulating film 60. Next, a trench 80a, a trench 80b, and a trench 80c reaching the base region 14 are formed under the trench 82a, the trench 82b, and the trench 82c, respectively, by, for example, RIE (FIG. 6). Note that the width of each of the trench 80 and the trench 82 formed may be narrower as it goes downward, as illustrated in FIG. 6.

Figure 7:
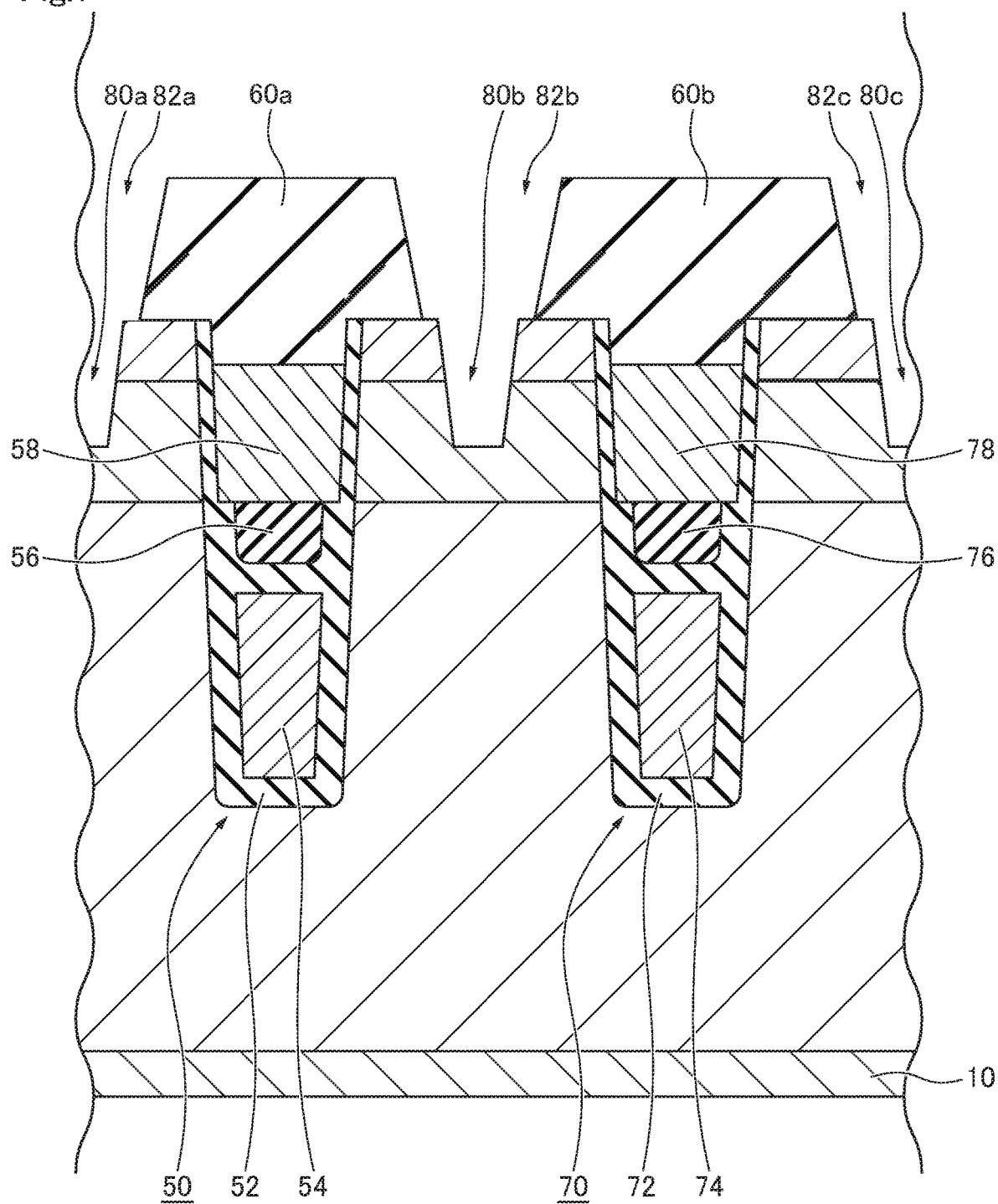
FIG. 7 is a schematic cross-sectional view illustrating the process of manufacturing the semiconductor device according to the first embodiment.

Next, the interlayer insulating film 60 is selectively etched using a chemical solution to widen the widths of the trenches 82a, 82b and 82c (FIG. 7).

Figure 8:
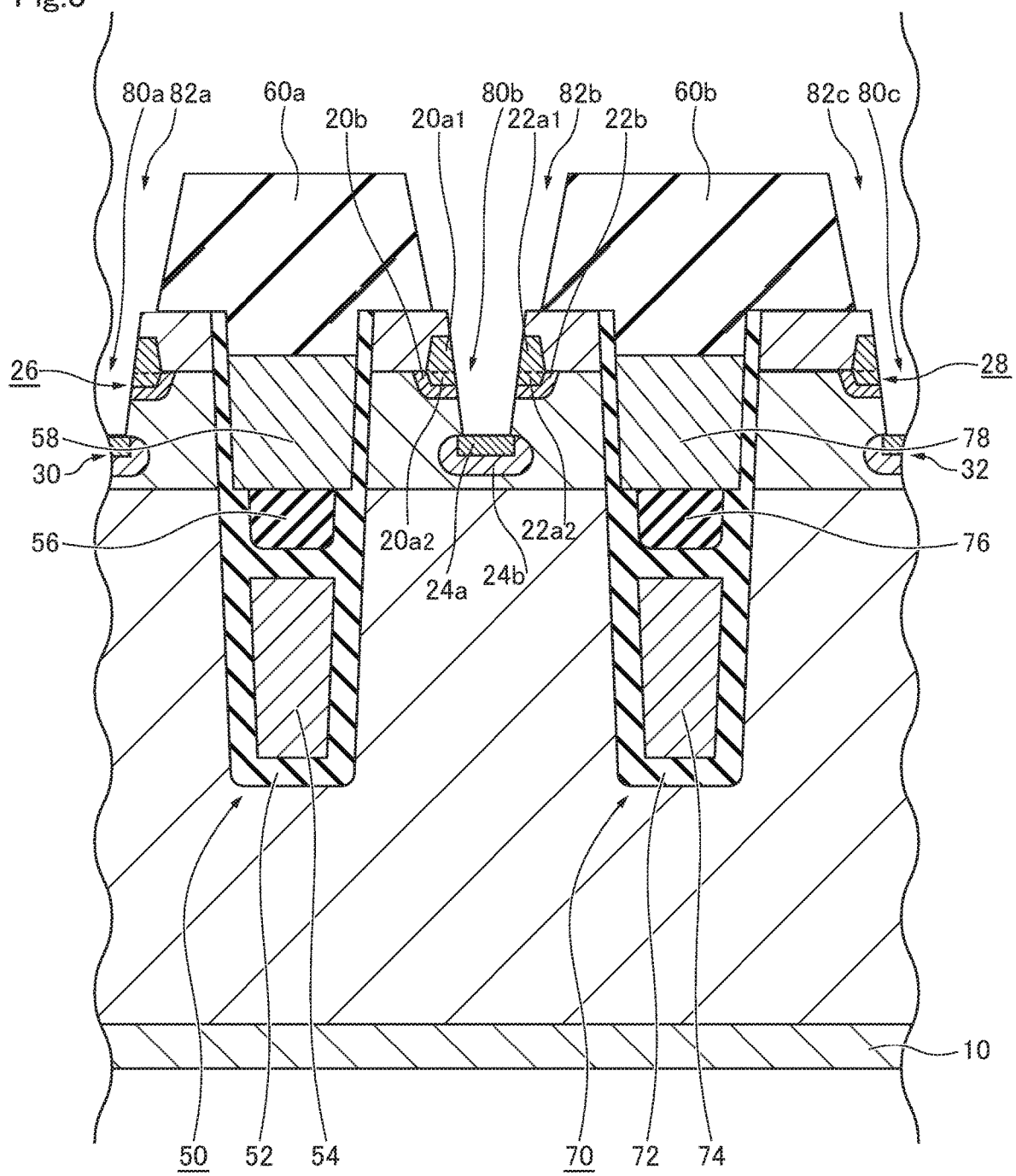
FIG. 8 is a schematic cross-sectional view illustrating the process of manufacturing the semiconductor device according to the first embodiment.
Figure 8:
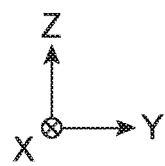

Next, for example, by ion implantation of B which is an example of p-type impurities, the first p$^+$ region 20, the second p region 22, the third p$^+$ region 24, the p$^+$ region 26, the p$^+$ region 28, the p$^+$ region 30, and the p$^+$ region 32 are formed. (FIG. 8). Next, a heat treatment is appropriately performed in order to activate impurities.

Figure 9:
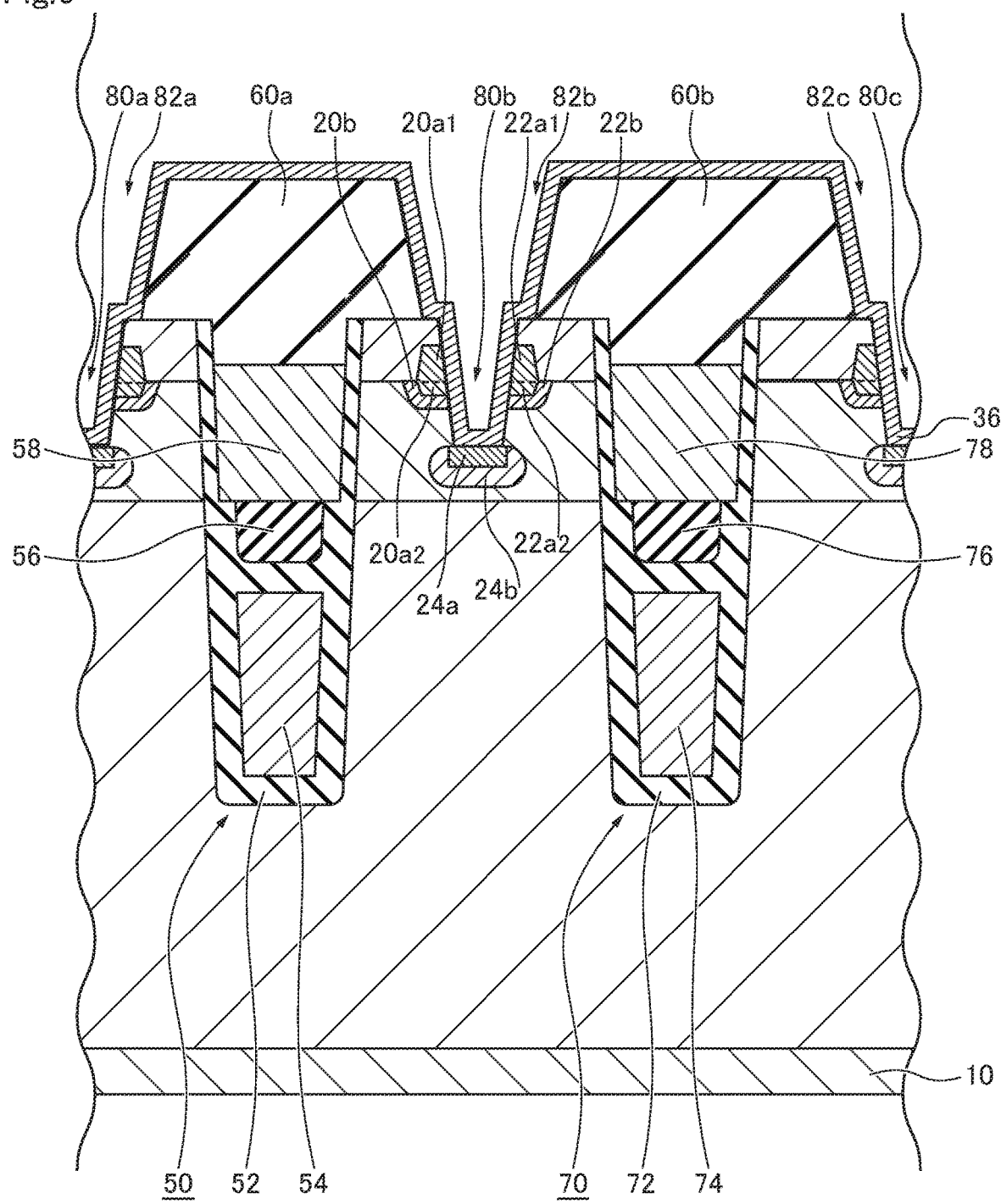
FIG. 9 is a schematic cross-sectional view illustrating the process of manufacturing the semiconductor device according to the first embodiment.
Figure 9:
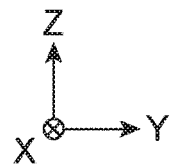

Next, the barrier metal 36 is formed in the trench 80, in the trench 82, and on a side surface and an upper surface of the interlayer insulating film 60 by, for example, sputtering (FIG. 9).

Next, the source electrode 42 and the drain electrode 38 are formed by, for example, CVD or physical vapor deposition (PVD). As described above, the semiconductor device according to the present embodiment is obtained.

Next, a function and an effect of the semiconductor device 100 according to the present embodiment will be described.

Conventionally, a structure has been used in which the base region 14 is provided between a plurality of the source regions 16. Meanwhile, in order to miniaturize the above structure, a structure has come to be used in which the base region 14 is provided below the source regions 16, a part of the source electrode 42 (for example, the second electrode portion 42b) reaching the base region 14 is provided between the source regions 16, and the source region 16 and the base region 14 are electrically connected to the source electrode 42.

Here, when a reverse voltage is applied to the semiconductor device 100, holes move in the base region 14. Then, the holes flow toward a part of the source electrode 42 reaching the base region 14. Originally, the voltage of the base region 14 is preferably equal to the potential of the source electrode 42 in order to suppress element breakdown caused when a reverse voltage is applied. However, when a potential difference is generated between the potential of the base region 14 and the potential of the source electrode 42, a parasitic bipolar transistor formed by the source region 16, the base region 14, and the drift layer 12 operates, and element breakdown occurs. Therefore, it has been required to prevent generation of a potential difference between the potential of the base region 14 and the potential of the source electrode 42.

In order to suppress the element breakdown, it is conceivable to provide the third p$^+$ region 24 having a higher p-type impurity concentration than the base region 14 below the second electrode portion 42b. This is because the hole conductivity in the third p$^+$ region 24 is higher than the hole conductivity in the base region 14, and therefore a potential difference from the potential of the source electrode 42 is hardly generated in the base region 14.

Here, when a region having a high p-type impurity concentration is provided in the base region 14, if p-type impurities diffuse into a channel of the MOSFET, a threshold voltage $V_{th}$ of the MOSFET increases. Generally, there is a relationship of tradeoff between the threshold voltage $V_{th}$ of the MOSFET and avalanche resistance. Therefore, it has been desired to increase the avalanche resistance while an increase in the threshold voltage $V_{th}$ is suppressed.

The semiconductor device 100 according to the present embodiment includes the first p$^+$ region 20 provided between the source region 16b and the second electrode portion 42b, the first p$^+$ region 20 having a higher p-type impurity concentration than the base region 14, and the second p$^+$ region 22 provided between the source region 16c and the second electrode portion 42b, the second p$^+$ region 22 having a higher p-type impurity concentration than the base region 14. Here, the third p$^+$ region 24 is provided apart from the first p$^+$ region 20 and the second p$^+$ region 22. The hole conductivity in each of the first p$^+$ region 20 and the second p$^+$ region 22 is higher than the hole conductivity in the base region 14, and therefore a potential difference from the potential of the source electrode 42 is hardly generated in the base region 14.

Figure 10:
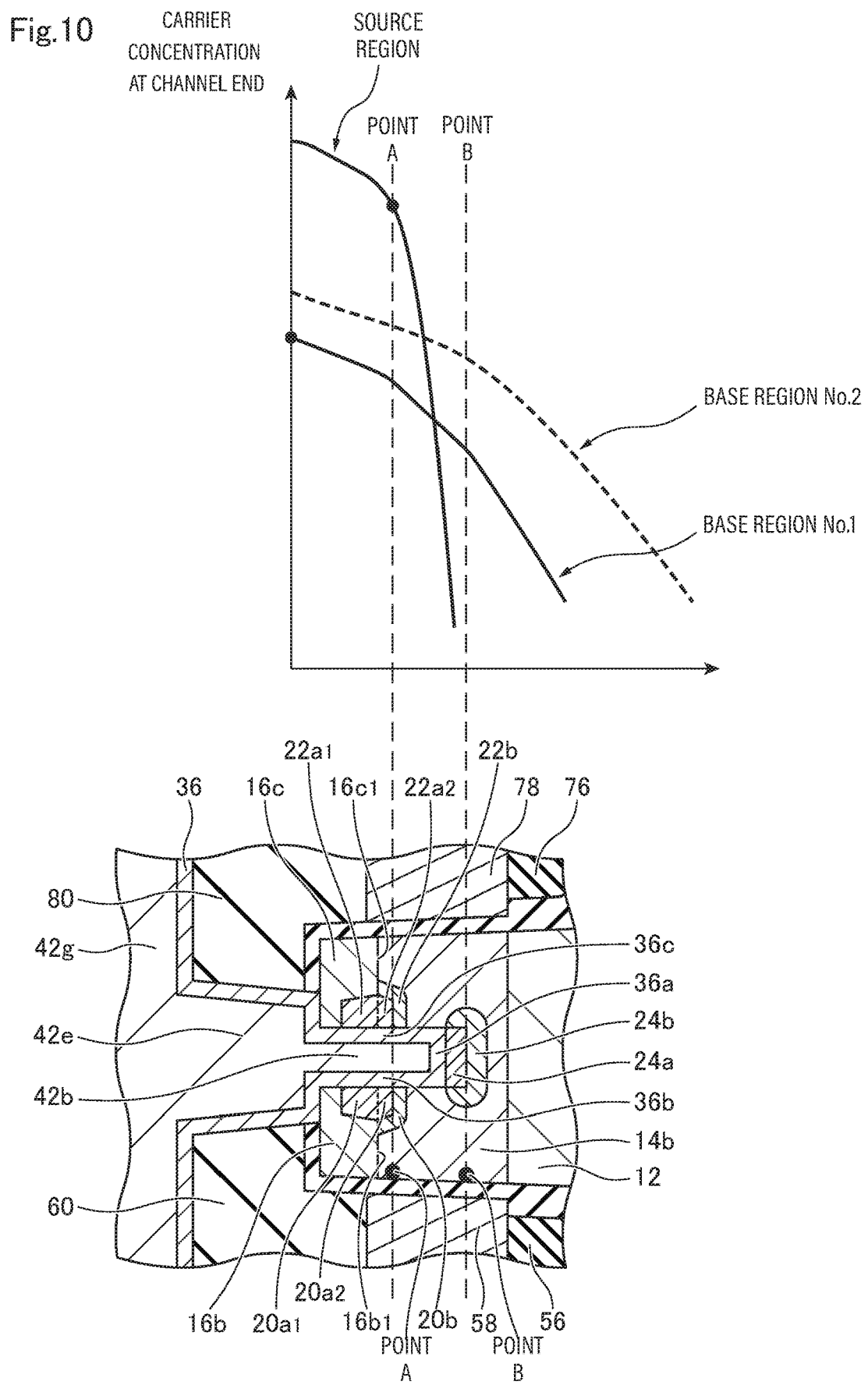
FIG. 10 is a schematic diagram for explaining a function and an effect of the semiconductor device according to the first embodiment.

FIG. 10 is a schematic diagram for explaining a function and an effect of the semiconductor device 100 according to the present embodiment. A point A in the vicinity of a channel of the MOSFET in the base region 14, and a point B in the vicinity of the channel of the MOSFET which is closer to the drift layer 12 are illustrated. In FIG. 10, "source region" indicates a carrier concentration (electron concentration) in the vicinity of a channel. In FIG. 10, "base region No. 1" indicates a carrier concentration (hole concentration) in the vicinity of a channel when the first p$^+$ region 20 and the second p$^+$ region 22 are not provided. In FIG. 10, "base region No. 2" indicates a carrier concentration (hole concentration) in the vicinity of a channel when the first p$^+$ region 20 and the second p$^+$ region 22 are provided.

The p-type impurity concentration at the point A is relatively high even when the first p$^+$ region 20 and the second p$^+$ region 22 are not provided. Therefore, even when the first p$^+$ region 20 and the second p$^+$ region 22 are newly provided and the p-type impurities diffuse to the point A, an electron concentration at the point A is much higher than the hole concentration, and therefore an influence on the threshold voltage $V_{th}$ is small. Meanwhile, the p-type impurity concentration at the point B is relatively low when the first p$^+$ region 20 and the second p$^+$ region 22 are not provided. When the first p$^+$ region 20 and the second p$^+$ region 22 are provided without being apart from the third p$^+$ region 24, the amount of p-type impurities diffusing to the point B is too large, and the threshold voltage $V_{th}$ increases. As a result, the avalanche resistance decreases. By providing the third p$^+$ region 24 apart from the first p$^+$ region 20 and the second p$^+$ region 22 as in the present embodiment, it is possible to suppress an increase in the threshold voltage $V_h$.

The first p$^-$ region 20 has the first p$^-$ region $20a_1$ provided above the lower surface 16b$_1$ of the source region 16b, and the first p$^+$ region $20a_2$ and the first p$^+$ region 20b provided below the lower surface 16b$_1$ of the source region 16b. The second p$^+$ region 22 has the second p$^+$ region $22a_1$ provided above the lower surface 16c$_1$ of the source region 16c, and the second p$^+$ region $22a_2$ and the second p$^+$ region 22b provided below the lower surface 16c$_1$ of the source region 16c. This is for making flow of holes to the second electrode portion 42b easy by providing a region having a high p-type impurity density below the lower surface of the source region 16.

The source region 16b extends over the first p$^+$ region 20. The source region 16c extends over the second p$^+$ region 22. This is for lowering the potential of the source region 16 by electrically connecting the source region 16b and the source region 16c to the second electrode portion 42b sufficiently.

The semiconductor device 100 according to the present embodiment can provide a semiconductor device having high reliability.

Second Embodiment

A semiconductor device 110 according to the present embodiment is different from the semiconductor device 100 according to the first embodiment in that a first width of a first portion in a direction perpendicular to a direction in which a drain layer and a drift layer are stacked is larger than a second width of a second portion in the direction perpendicular to the direction in which the drain layer and the drift layer are stacked, and a third width of a third portion in the direction perpendicular to the direction in which the drain layer and the drift layer are stacked is larger than a fourth width of a fourth portion in the direction perpendicular to the direction in which the drain layer and the drift layer are stacked. Here, description of contents overlapping with those of the first embodiment is omitted.

Figure 11:
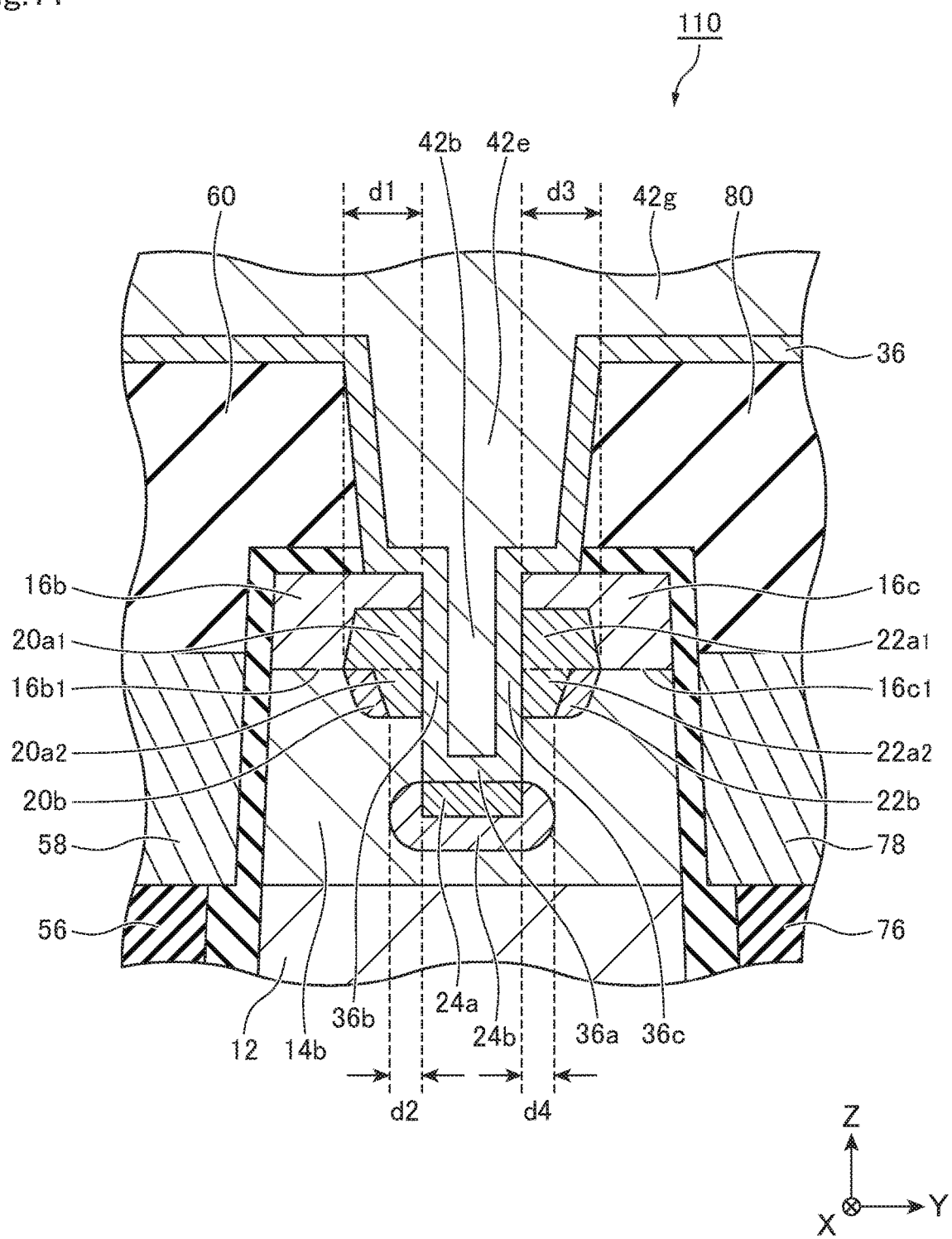
FIG. 11 is a schematic cross-sectional view of a main part of a semiconductor device according to a second embodiment.

FIG. 11 is a schematic cross-sectional view of a main part of the semiconductor device 110 according to the present embodiment. A first width $d_1$ of a first p$^+$ region $20a_1$ is larger than a second width $d_2$ of a first p$^+$ region $20a_2$, and a third width $d_3$ of a second p$^+$ region $22a_1$ is larger than a fourth width $d_4$ of a second p$^+$ region $22a_2$. Here, the width is a length in a direction parallel to the XY plane.

If a distance between a second electrode portion 42b and a channel of a MOSFET is shortened, the resistance of holes flowing in a base region 14 decreases. However, the semiconductor device 110 according to the present embodiment can increase the volume of a p$^+$ region to reduce the resistance of holes flowing in the base region 14 without shortening the distance between the second electrode portion 42*b* and the channel of the MOSFET. This makes it possible to provide a semiconductor device having high reliability.

Third Embodiment

A semiconductor device 120 according to the present embodiment is different from the semiconductor device 100 according to the first embodiment and the semiconductor device 110 according to the second embodiment in that a second semiconductor region provided between a first insulating film and a third electrode extends over a third semiconductor region and between the third semiconductor region and the third electrode, and a second semiconductor region provided between a second insulating film and the third electrode extends over a fourth semiconductor region and between the fourth semiconductor region and the third electrode. In addition, the semiconductor device 120 according to the present embodiment is different from the semiconductor device 100 according to the first embodiment and the semiconductor device 110 according to the second embodiment in that a third lower surface of the third semiconductor region is in contact with a first semiconductor region, and a fourth lower surface of the fourth semiconductor region is in contact with the first semiconductor region. Here, description of contents overlapping with those of the first and second embodiments is omitted.

Figure 12:
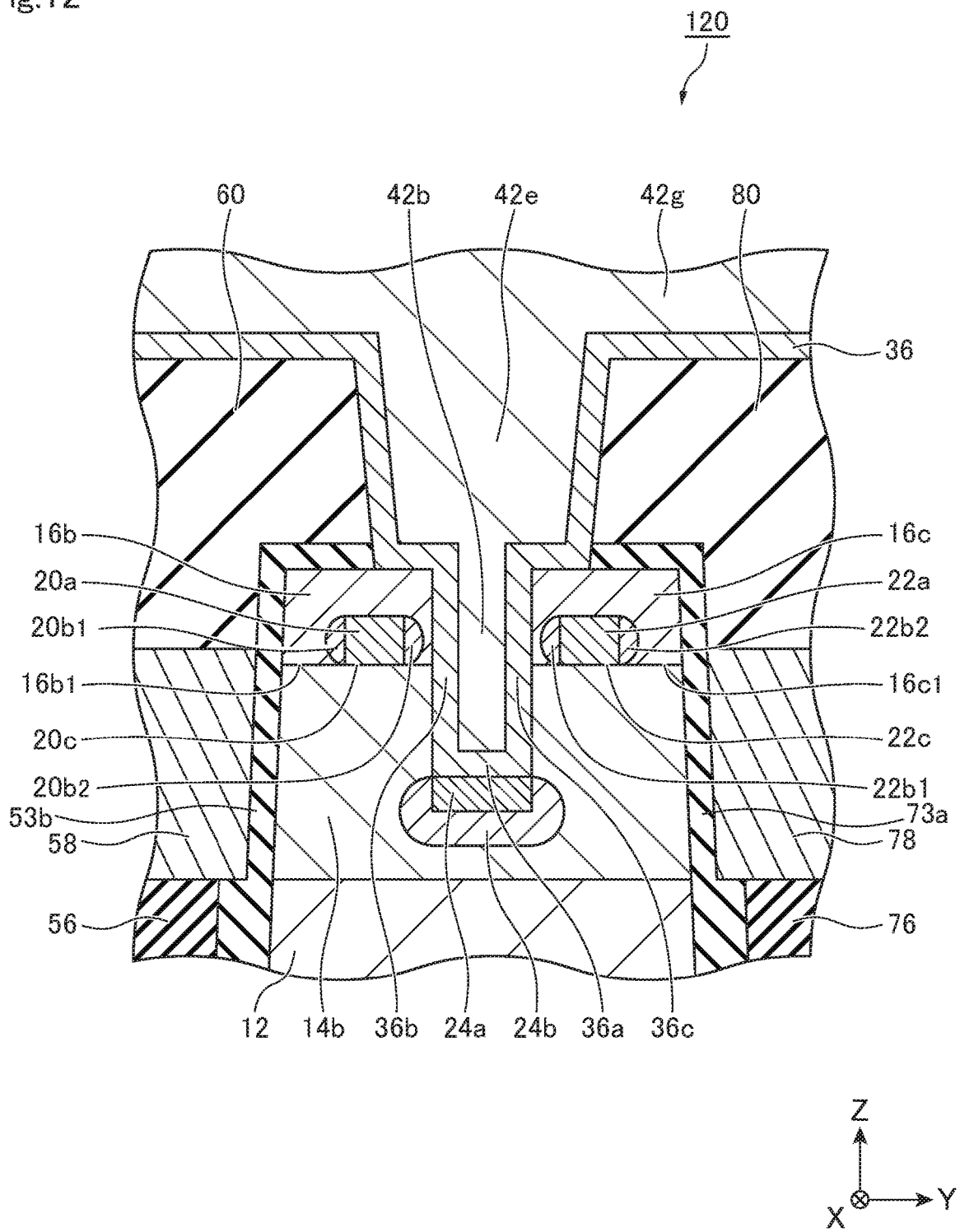
FIG. 12 is a schematic cross-sectional view of a main part of a semiconductor device according to a third embodiment.

FIG. 12 is a schematic cross-sectional view of a main part of the semiconductor device 120 according to the present embodiment.

A source region 16*b* extends over a first p⁺ region 20 and between the first p⁺ region 20 and a second electrode portion 42*b*. A source region 16*c* extends over a second p⁺ region 22 and between the second p⁺ region 22 and the second electrode portion 42*b*.

In the semiconductor device 120, the first p⁺ region 20 is not in contact with a barrier metal 36*b* provided on a left side surface of the second electrode portion 42*b*. The second p⁺ region 22 is not in contact with a barrier metal 36*c* provided on a right side surface of the second electrode portion 42*b*.

Also the semiconductor device 120 according to the present embodiment can increase the volume of a p⁺ region to reduce the resistance of holes flowing in a base region 14 without shortening a distance between the second electrode portion 42*b* and a channel of a MOSFET. This makes it possible to provide a semiconductor device having high reliability.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first semiconductor layer of first conductivity type;
a second semiconductor layer of first conductivity type provided on the first semiconductor layer;
a first semiconductor region of second conductivity type provided on the second semiconductor layer;
a second semiconductor region of first conductivity type provided on the first semiconductor region;
a first electrode provided in a first trench, the first trench reaching the second semiconductor layer from above the first semiconductor region, the first electrode facing the first semiconductor region via a first insulating film;
a second electrode provided in a second trench, the second trench reaching the second semiconductor layer from above the first semiconductor region, the second electrode facing the first semiconductor region via a second insulating film;
a third electrode including a first electrode portion, a second electrode portion provided on the first electrode portion and a third electrode portion provided on the second electrode portion, the first electrode portion being provided between the first trench and the second trench, the first electrode portion reaching the first semiconductor region from above the second semiconductor region, the first electrode portion being electrically connected to the first semiconductor region and the second semiconductor region;
a third semiconductor region provided between the third electrode and the second semiconductor region provided between the first insulating film and the third electrode, the third semiconductor region having a higher concentration of impurities of second conductivity type than the first semiconductor region;
a fourth semiconductor region provided between the third electrode and the second semiconductor region provided between the second insulating film and the third electrode, the fourth semiconductor region having a higher concentration of impurities of second conductivity type than the first semiconductor region; and
a fifth semiconductor region provided between the first semiconductor region and the third electrode, the fifth semiconductor region being provided apart from the third semiconductor region and the fourth semiconductor region, the fifth semiconductor region having a higher concentration of impurities of second conductivity type than the first semiconductor region.

2. The semiconductor device according to claim 1, wherein
the second semiconductor region provided between the first insulating film and the third electrode extends over the third semiconductor region, and
the second semiconductor region provided between the second insulating film and the third electrode extends over the fourth semiconductor region.

3. The semiconductor device according to claim 1, wherein
the second semiconductor region provided between the first insulating film and the third electrode extends over the third semiconductor region and between the third semiconductor region and the third electrode, and
the second semiconductor region provided between the second insulating film and the third electrode extends over the fourth semiconductor region and between the fourth semiconductor region and the third electrode.

4. The semiconductor device according to claim 1, further comprising a sixth electrode, wherein
the first semiconductor layer is provided between the sixth electrode and the second semiconductor layer.

5. The semiconductor device according to claim 1, wherein
the third semiconductor region has a first portion and a second portion, the first portion is provided above a first lower surface of the second semiconductor region provided between the first insulating film and the third electrode, and the second portion is provided below the first lower surface, and the fourth semiconductor region has a third portion and a fourth portion, the third portion is provided above a second lower surface of the second semiconductor region provided between the second insulating film and the third electrode, and the fourth portion is provided below the second lower surface of the second semiconductor region.

6. The semiconductor device according to claim 5, wherein
a first width of the first portion in a second direction perpendicular to a first direction in which the first semiconductor layer and the second semiconductor layer are stacked is larger than a second width of the second portion in the second direction, and
a third width of the third portion in the second direction is larger than a fourth width of the fourth portion in the second direction.

7. The semiconductor device according to claim 1, further comprising:
a fourth electrode provided below the first electrode in the first trench, the fourth electrode facing the second semiconductor layer via a third insulating film; and
a fifth electrode being provided below the second electrode in the second trench, the fifth electrode facing the second semiconductor layer via a fourth insulating film.

8. The semiconductor device according to claim 7, wherein
the first insulating film has a smaller film thickness than the third insulating film in a second direction perpendicular to a first direction in which the first semiconductor layer and the second semiconductor layer are stacked, and
the second insulating film has a smaller film thickness than the fourth insulating film in the second direction.

9. The semiconductor device according to claim 7, further comprising:
a fifth insulating film provided in the first trench, the fifth insulating film being provided between the first electrode and the fourth electrode, the fifth insulating film containing phosphosilicate glass (PSG); and
a sixth insulating film provided in the second trench, the sixth insulating film being provided between the second electrode and the fifth electrode, the sixth insulating film containing phosphosilicate glass (PSG).

10. The semiconductor device according to claim 1, further comprising:
a barrier metal including a first barrier metal portion provided between the fifth semiconductor region and the third electrode,
a second barrier metal portion provided between the third semiconductor region and the third electrode, and
a third barrier metal portion provided between the fourth semiconductor region and the third electrode.

11. The semiconductor device according to claim 10, wherein
the fifth semiconductor region and the first barrier metal portion are in contact with each other,
the third semiconductor region and the second barrier metal portion are in contact with each other, and
the fourth semiconductor region and the third barrier metal portion are in contact with each other.

12. The semiconductor device according to claim 10, further comprising:
a seventh insulating film provided on the first electrode;
an eighth insulating film provided on the second electrode, wherein
the second electrode portion is provided between the seventh insulating film and the eighth insulating film, and wherein
the third electrode portion is provided above the seventh insulating film and the eighth insulating film, and wherein
the barrier metal includes
a fourth barrier metal portion provided between the second electrode portion and the second semiconductor region provided between the first insulating film and the first electrode portion;
a fifth barrier metal portion provided between the second electrode portion and the second semiconductor region provided between the second insulating film and the first electrode portion;
a sixth barrier metal portion provided between the seventh insulating film and the second electrode portion;
a seventh barrier metal portion provided between the eighth insulating film and the second electrode portion;
an eighth barrier metal portion provided between the seventh insulating film and the third electrode portion; and
a ninth barrier metal portion provided between the eighth insulating film and the third electrode portion.

* * * * *